(12) United States Patent

Aderhold

(10) Patent No.: US 12,680,761 B2

(45) Date of Patent: Jul. 14, 2026

(54) CONVECTIVE SUBSTRATE COOLING WITH MINIMAL PRESSURE CHANGE

(71) Applicant: Applied Materials, Inc., Santa Clara, CA (US)

(72) Inventor: Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 783 days.

(21) Appl. No.: 18/174,306

(22) Filed: Feb. 24, 2023

(65) Prior Publication Data

US 2024/0288220 A1     Aug. 29, 2024

(51) Int. Cl.
| | |
|---|---|
| *F27D 1/00* | (2006.01) |
| *F27D 9/00* | (2006.01) |
| *F27D 19/00* | (2006.01) |
| *H10P 72/00* | (2026.01) |

(52) U.S. Cl.
CPC ............. *F27D 1/0043* (2013.01); *F27D 9/00* (2013.01); *F27D 19/00* (2013.01); *H10P 72/0436* (2026.01); *F27D 2009/0005* (2013.01); *F27D 2009/0018* (2013.01); *F27D 2019/0056* (2013.01)

(58) Field of Classification Search
CPC .......... F27D 1/0043; F27D 9/00; F27D 19/00; F27D 2009/0005; F27D 2009/0018; F27D 2009/0056; H01L 21/02; H01L 21/67; H01L 21/67115
See application file for complete search history.

(56) References Cited

U.S. PATENT DOCUMENTS

| | | | | |
|---|---|---|---|---|
| 7,041,939 B2 * | 5/2006 | Hosokawa | ........ | H01L 21/67115 118/724 |
| 7,072,579 B2 * | 7/2006 | Kusuda | ............. | H01L 21/67115 118/724 |
| 7,091,453 B2 * | 8/2006 | Murayama | .......... | F27B 17/0025 118/724 |
| 8,111,978 B2 * | 2/2012 | Sorabji | ............... | C23C 16/4404 392/416 |

(Continued)

FOREIGN PATENT DOCUMENTS

| | | |
|---|---|---|
| CN | 102077330 A | 5/2011 |
| KR | 101464931 B1 | 11/2014 |

(Continued)

OTHER PUBLICATIONS

PCT/US2024/015194, International Search Report and Written Opinion dated May 21, 2024, 8 pages.

*Primary Examiner* — Brian P Wolcott

(74) *Attorney, Agent, or Firm* — Patterson + Sheridan, LLP

(57) ABSTRACT

Embodiments of the present disclosure generally relate to a reflector plate assembly. The reflector plate assembly includes a reflector plate and a baffle. The reflector plate includes a gas conduit, a plurality of gas passages, a plurality of lift pin holes, and a gas inlet. The gas conduit includes a first opening on a front side of the reflector plate and a second opening on a backside of the reflector plate adjacent to the gas conduit. The baffle is attached at a first end to a support base of an edge ring. The baffle is attached at a second end to the backside of the reflector plate. The baffle forms an opening in the backside of the reflector plate to the gas conduit.

20 Claims, 3 Drawing Sheets

(56)                    References Cited

U.S. PATENT DOCUMENTS

| | | | | |
|---|---|---|---|---|
| 8,980,767 | B2 * | 3/2015 | Rogers | H01L 21/02263 |
| | | | | 438/788 |
| 9,508,561 | B2 * | 11/2016 | Naik | H01L 21/67184 |
| 10,573,498 | B2 * | 2/2020 | Swaminathan | C23C 14/505 |
| 10,704,147 | B2 * | 7/2020 | Rasheed | H01L 21/68735 |
| 10,781,533 | B2 * | 9/2020 | Samir | C30B 25/12 |
| 2018/0061615 | A1 | 3/2018 | Kim et al. | |
| 2020/0357664 | A1 | 11/2020 | Hung | |
| 2022/0005678 | A1 | 1/2022 | Inada et al. | |
| 2022/0163394 | A1 | 5/2022 | Aderhold | |

FOREIGN PATENT DOCUMENTS

| | | |
|---|---|---|
| TW | I430394 B | 3/2014 |
| WO | 2010048237 A2 | 4/2010 |

* cited by examiner

CONVECTIVE SUBSTRATE COOLING WITH MINIMAL PRESSURE CHANGE

BACKGROUND

Field

Embodiments of the present disclosure generally relate to apparatus for processing a substrate, and more specifically to reflector plates for rapid thermal processing.

Description of the Related Art

Rapid thermal processing (RTP) is a process for annealing substrates during semiconductor fabrication. During this process, thermal radiation is used to rapidly heat a substrate in a controlled environment to a maximum temperature of over 1200° C. above room temperature. During cooling, the substrate is quickly moved away from a bottom of a chamber and toward a reflector plate. This movement can create a pressure delta between the substrate and the reflector plate, causing the substrate to move relative to a substrate support ring that is supporting the substrate. This movement can affect the processing of the substrate, leading to lower throughput.

Therefore, there is a need for methods and apparatuses for reducing substrate movement.

SUMMARY

Embodiments of the present disclosure generally relate to apparatus for processing a substrate, and more specifically to reflector plates for rapid thermal processing.

In one embodiment, a reflector plate assembly for processing a substrate is provided. The reflector plate assembly includes a reflector plate and a baffle. The reflector plate includes a gas conduit, a plurality of gas passages, a plurality of lift pin holes, and a gas inlet. The gas conduit includes a first opening on a front side of the reflector plate and a second opening on a backside of the reflector plate adjacent to the gas conduit. The baffle is attached at a first end to a support base of an edge ring. The baffle is attached at a second end to the backside of the reflector plate. The baffle forms an opening in the backside of the reflector plate to the gas conduit.

In another embodiment, a processing chamber for processing a substrate is provided. The processing chamber includes an edge ring for supporting a substrate in the processing chamber, a heating apparatus spaced apart from a front side of a substrate, a reflector plate assembly spaced apart from a backside of a substrate, and a baffle. The edge ring comprises a support base. The reflector plate assembly includes a reflector plate. The reflector plate includes a gas conduit, a plurality of gas passages having a first opening on a front side of the reflector plate and a second opening on a backside of the reflector plate adjacent to the gas conduit, a plurality of lift pin holes, and a gas inlet; The baffle is attached at a first end to a support base of an edge ring, and attached at a second end to the backside of the reflector plate. The baffle forms an opening in the backside of the reflector plate to the gas conduit.

In another embodiment, a controller stores instructions that, when executed by a computer processor, cause the controller to perform operations of actuating components of a processing chamber between a processing position, a post-cooling position, and a transfer position, adjusting an actuator and gas flow controls based off one or more of sensor readings, a system model, and stored readings and calculations, and synchronizing a rate of expansion or contraction of the baffle with a flow of gas to or from the baffle. The processing chamber includes an edge ring for supporting a substrate in the processing chamber. The edge ring includes a support base, a heating apparatus spaced apart from a front side of a substrate, a reflector plate assembly spaced apart from a backside of a substrate, and a baffle. The reflector plate assembly includes a reflector plate. The reflector plate includes a gas conduit, a plurality of gas passages having a first opening on a front side of the reflector plate and a second opening on a backside of the reflector plate adjacent to the gas conduit, a plurality of lift pin holes, and a gas inlet. The baffle is attached at a first end to a support base of an edge ring and attached at a second end to the backside of the reflector plate. The baffle forms an opening in the backside of the reflector plate to the gas conduit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2 is a top plan view of a reflector plate of an example RTP chamber according to at least one embodiment of the present disclosure.

FIG. 3 is a control schematic for use within the RTP chamber according to at least one embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus for processing a substrate, and more specifically to reflector plates for rapid thermal processing.

Figure 1A:
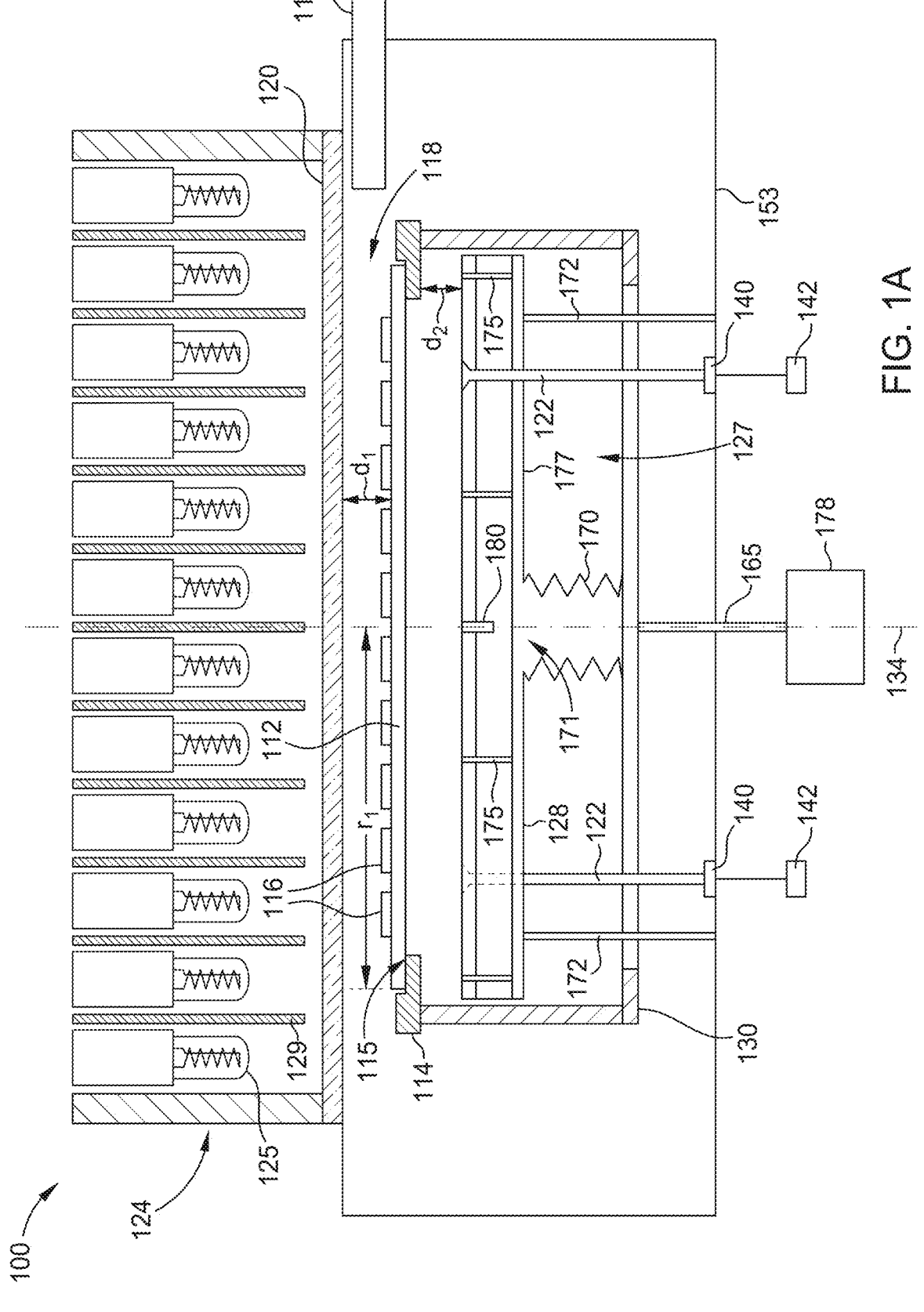
FIG. 1A is a sectional view of an RTP chamber in a processing position according to at least one embodiment of the present disclosure.
Figure 1B:
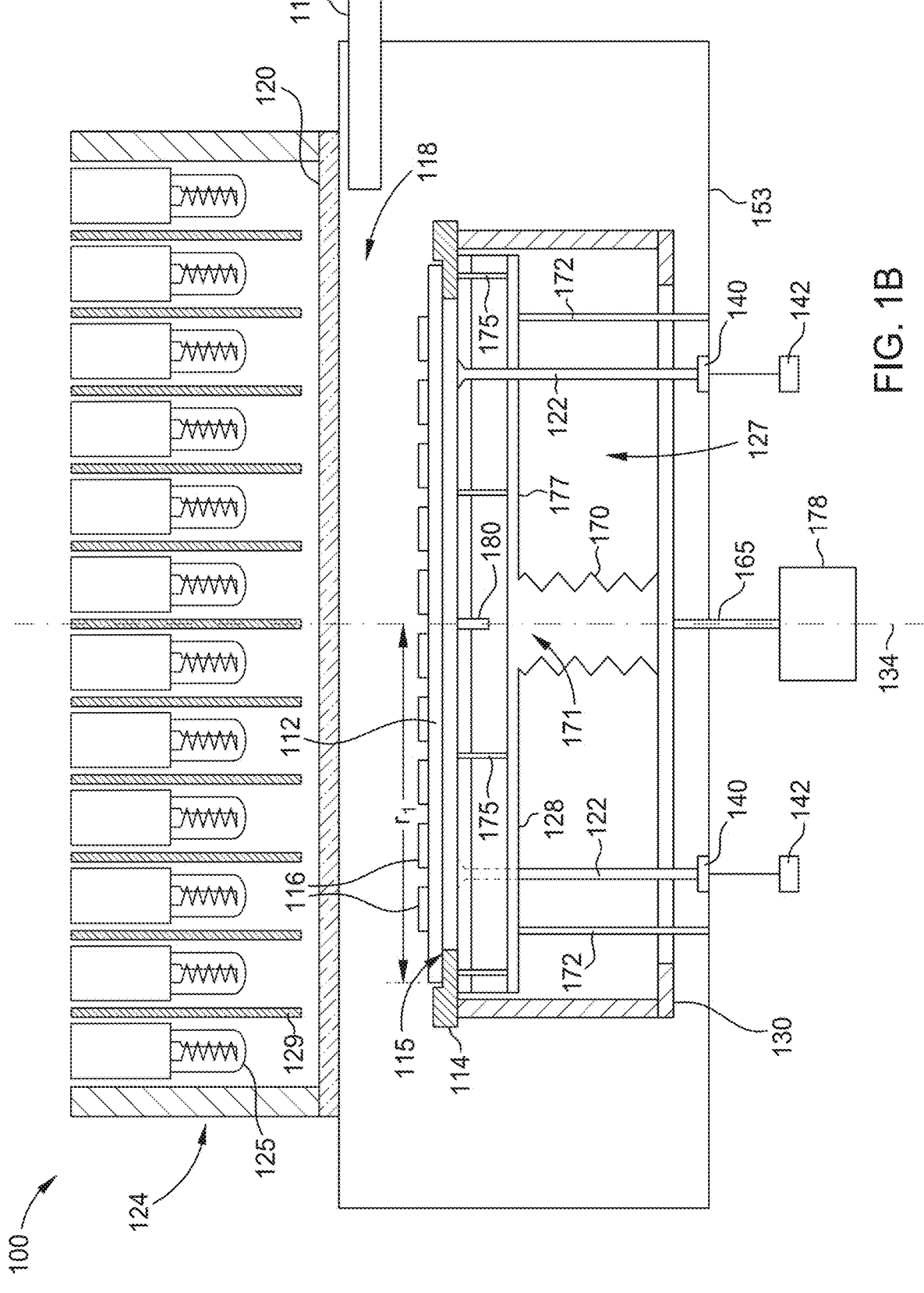
FIG. 1B is a sectional view of an RTP chamber in a post-cooling position according to at least one embodiment of the present disclosure.
Figure 1C:
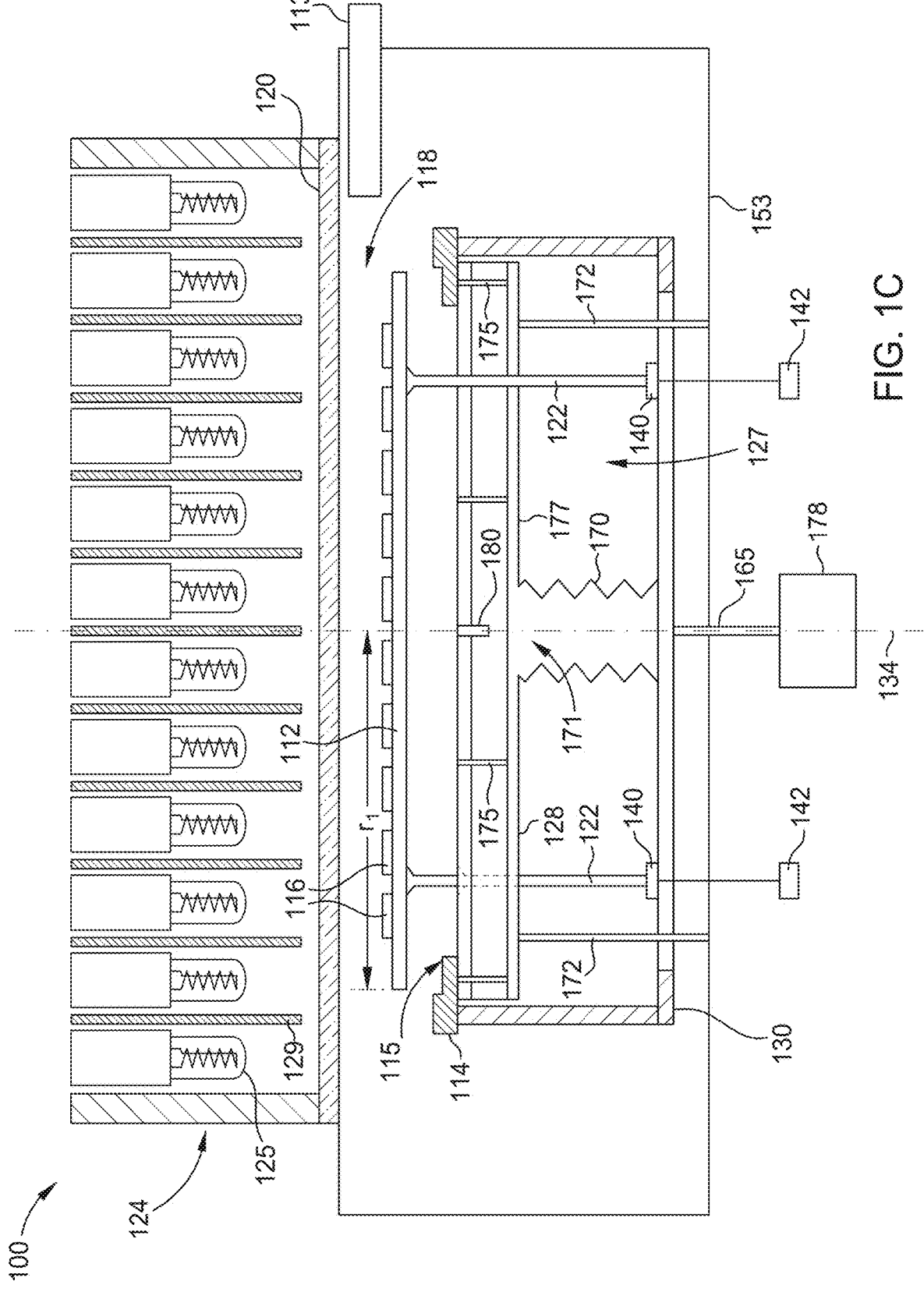
FIG. 1C is a sectional view of an RTP chamber in a transfer position according to at least one embodiment of the present disclosure.

FIG. 1A is a sectional view of a rapid thermal processing (RTP) chamber 100 in a processing position. FIG. 1B is a sectional view of an RTP chamber in a post-cooling position. FIG. 1C is a sectional view of the RTP chamber 100 in a transfer position. A substrate 112, for example a semiconductor wafer such as a silicon wafer, to be thermally processed is passed through a valve or access port 113 into the process area 118 of the RTP chamber 100. While in the transfer position, the substrate is positioned onto one or more lift pins 122. In the processing position and post-cooling position, the substrate 112 is supported on its periphery by a substrate support shown in this embodiment as an edge ring 114, which may have an annular sloping shelf 115 contacting the corner of the substrate 112. The substrate 112 is oriented such that processed features 116 already formed in or on a front side of the substrate 112 face toward a process area 118, the process are defined on an upper side by a window 120. The substrate 112 has a radius $r_1$ from about 200 mm to about 500 mm, such as about 350 mm to about 450 mm.

The window 120 can be located a first distance $d_1$ from the substrate 112 such that the transparent quartz window 120 has minimal effect on cooling of the substrate 112 during processing. In the processing position, as shown in FIG. 1A, the first distance $d_1$ between the substrate 112 and the window 120 is from about 5 mm to about 50 mm, such as about 20 mm. Contrary to the schematic illustration, the features 116 for the most part do not project substantial distances beyond the surface of the substrate 112 but constitute patterning near the plane of the surface. In the transfer position, as shown in FIG. 1C, lift pins 122 may be used to support the backside of the substrate 112 when the substrate is handed between a paddle or robot blade bringing the substrate 112 into the RTP chamber 100 and onto the lift pins 122. To move the substrate 112 from the transfer position to the processing position, a lift pin stop 140 may be actuated downward by a lift pin actuator 144 to engage the substrate with the edge ring 114. To move the substrate from the post-cooling position to the transfer position, the lift pin stop is actuated upward by the lift pin actuator 142 to disengage the substrate 112 from the edge ring 114 and raise the substrate 112 to a position to be moved out of the RTP chamber 100 by the paddle or robot blade.

A radiant heating apparatus 124 is positioned above the window 120 to direct radiant energy toward the substrate 112 and to heat the substrate 112. In the RTP chamber 100, the radiant heating apparatus 124 includes a plurality of lamps 125 positioned in respective reflective tubes 129. In one embodiment, the reflective tubes 129 are arranged in a hexagonal close-packed array above the window 120. In some embodiments, the lamps 125 are high-intensity tungsten-halogen lamps. The lamps 125 are divided into zones arranged generally ring-like about a center axis 134. Control circuitry varies the voltage delivered to the lamps 125 in the different zones to tailor the radial distribution of radiant energy.

Controlling the temperature uniformly across the substrate 112 to a closely defined temperature can be beneficial for processing uniformity. In this regard, the processing chamber 100 includes a reflector plate assembly 127. The reflector plate assembly 127 includes a reflector plate 128 extending parallel to and over an area greater than the substrate 112 and faces a backside of the substrate 112. The reflector plate 128 efficiently reflects heat radiation emitted from the substrate 112 back toward the substrate 112. The reflector plate 128 is coupled to the chamber 100 such that the reflector plate remains fixed during the movement between processing position, a post-cooling position, and a transfer position. In some embodiments, the edge ring 114 is a second distance $d_2$ from the reflector plate 128 while in the processing position. The second distance $d_2$ is from of about 3 mm to about 25 mm, such as about 6 mm. In one embodiment, when the RTP chamber 100 is actuated from the processing position to the post-cooling position, the second distance $d_2$ is about 0 mm, e.g., the edge ring 114 and reflector plate 128 are in contact with each other. In other embodiments, the second distance $d_2$ is less than about 1 mm when the RTP chamber in in the post-cooling position.

The reflector plate 128 includes a gas inlet 180 to provide a cooling gas to the substrate 112 and a plurality of gas passages 175 to allow gas to flow from a front side of the reflector plate 128 to a gas conduit 177 on a backside of the reflector plate 128. The gas conduit 177 flows the gas from the front side of the reflector plate 128 toward a baffle 170 (described below) after the gas exits the gas passages 175. The reflector plate 128 is connected to a base 153 of the processing chamber 100 by one or more reflector supports 172.

The window 120 and the base 153 form the process area 118 of the processing chamber. The window 120 may include a material that is transparent to radiation, such as quartz. The base 153 is substantially parallel to the window 120 and is made of metal or other material that is significantly non-transparent. The edge ring 114 is supported on a support base 130 that is mechanically coupled to an actuator 178 positioned outside the chamber by a shaft 165. The support base 130 supports the edge ring using a magnetic field within a channel 131. The magnetic field rotates the edge ring 114 within the channel 131 and hence rotates the substrate 112 about the center axis 134 of the processing chamber 100. An actuator 178 additionally provides height adjustment of the shafts 165, and thus the substrate 112, during processing. In one embodiment, the shaft 165 is connected to the support base 130 at a center point of the support base 130 aligned with the center axis 134. In another embodiment, the one or more shafts 165 are connected to the support base 130 at one or more points spaced radially from the center axis 134 and equidistant from the center axis.

The reflector plate assembly 127 further includes a baffle 170. In one embodiment, a baffle 170 is connected at a first end to the support base 130 at a center point of the support base 130 aligned with the center axis 134. The baffle 170 is further connected to the backside of the reflector plate 128. The baffle 170 forms an opening 171 in the center of the backside of the reflector plate 128 aligned with the center axis 134 to allow gas to move into and out of the baffle 170 via the gas conduit 177. The baffle 170 has a first volume $V_1$ that is greater than or equal to a second volume $V_2$. The second volume $V_2$ is a portion of the volume between the reflector plate 128 and the edge ring 114. The second volume $V_2$ is defined by Equation 1:

$$V_2 = \pi r_1^2 \times d_2 \qquad (1)$$

The baffle 170 may include steel, Teflon or other similar materials. In the processing position (FIG. 1A), the baffle 170 is in a contracted position. In the post-cooling position (FIG. 1B) and a transfer position (FIG. 1C), the baffle 170 is in an expanded position. The processing chamber 100 shifts from a processing position to the post-cooling position by lowering the edge ring 114 toward the base 153 of the processing chamber 100. The gas inlet 180 flows the cooling gas to cool the substrate 112 as the substrate 112 moves to the post-cooling position. The cooling gas may include helium, hydrogen, argon, nitrogen, or other similar gas. The movement of the edge ring 114 toward the base 153 of the processing chamber 100 moves the substrate 112 toward the reflector plate 128 the end ring 114 engages the reflector plate 128. The movement of the edge ring 114 toward the base 153 of the processing chamber 100 shifts the baffle 170 from the contracted position to the expanded position. As the reflector plate 128 remains stationary, the first end of the baffle 170 moves with the support base 130 toward the base 153 of the processing chamber 100, causing the baffle 170 to expand.

The processing chamber 100 shifts from the post-cooling position to the transfer position by actuating the lift pins 122 upward until the lift pins 122 engage the backside of the substrate 112. The lift pins 122 are actuated upward using the lift pin stops 140 and the lift pin actuator 142. The lift pin actuator 142 actuates the lift pin stop 140 upward until the lift pin stops 140 engage the lift pins 122. The lift pin actuator 142 continues to actuate the lift pin stops 140 and the lift pins 122 upward until the lift pins 122 disengage the substrate 112 from the edge ring 114 to enable the paddle or robot blade to remove the substrate 112 from the process chamber 100 or to reposition the substrate on the edge ring 114.

While shifting the processing chamber 100 from the processing position to the post-cooling position, the second volume $V_2$ of cooling gas between the substrate 112 and the reflector plate 128 may become trapped and cause the substrate 112 to disengage from the edge ring 114 before the lift pins 122 engage the substrate 112. This may cause the substrate 112 to be misaligned within the process chamber 100 and thus cause complications in manufacturing. By expanding the baffle 170 in conjunction with the shift from the processing position to the transfer position, the second volume $V_2$ of gas is transferred through the gas passages 175 and into the first volume $V_1$ of the baffle 170. Further, by shifting from a contracted position to an expanded position, the baffle 170 pulls the second volume $V_2$ of gas through the gas passages 175 and into the first volume $V_1$ of the baffle 170, creating a vacuum to secure the substrate 112 on the edge ring 114.

In one embodiment, the processing chamber 100 shifts from a transfer position to a processing position by raising the edge ring 114 away from the base 153 of the processing chamber 100 and lowering the lift pins 122. A substrate 112, which has been brought into the processing chamber 100 through the access port 113 and placed onto the lift pins 122, is engaged by the edge ring 114 as the edge ring 114 is raised away from the base 153 of the processing chamber 100 and the lift pins 122 are lowered by the lift pin actuator 142. The edge ring 114 disengages the substrate 112 from the lift pins 122 and moves the substrate 112 away from the reflector plate 128. The lift pin actuator 142 actuates the lift pins stop 140 downward, allowing the lift pins 122 to move downward into the lift pin holes 223 (shown in FIG. 2). The movement of the edge ring 114 away from the base 153 of the processing chamber shifts the baffle 170 from the expanded position to the contracted position. As the reflector plate 128 remains stationary, the first end of the baffle 170 moves with the support base 130 away from the base 153 of the processing chamber, causing the baffle to contract.

In another embodiment, the processing chamber 100 shifts from the transfer position to the post-cooling position and then to the processing position. The lift pin actuator 142 actuates the lift pins stops 140 downward, allowing the lift pins to move downward into the lift pin holes 223 (shown in FIG. 2). The edge ring 112 is raised away from the base 153 of the processing chamber 100. A substrate 112, which has been brought into the processing chamber 100 through the access port 113 and placed onto the lift pins 122, is engaged by the edge ring 114 as the edge ring 114 is raised away from the base 153 of the processing chamber 100. The edge ring 114 disengages the substrate 112 from the lift pins 122 and moves the substrate 112 away from the reflector plate 128.

The movement of the edge ring 114 away from the base 153 of the processing chamber shifts the baffle 170 from the expanded position to the contracted position. As the reflector plate 128 remains stationary, the first end of the baffle 170 moves with the support base 130 away from the base 153 of the processing chamber, causing the baffle to contract.

While shifting the processing chamber 100 from the transfer position to the processing position, the first volume $V_1$ of gas in the baffle 170 may be transferred from the baffle 170 to the second volume $V_2$ of the process chamber 100. By contracting the baffle 170 in conjunction with the shift from the transfer position to the processing position, the first volume $V_1$ of gas is transferred through the gas passages 175 and into the second volume $V_2$ of the process chamber 100. In one embodiment, the processing chamber 100 includes an exhaust port through which the gas from the first volume $V_1$ of the baffle 170 may be removed from the processing chamber. In another embodiment, the baffle 170 includes an exhaust port through which the gas from the second volume $V_2$ of the process chamber 100 may be removed from the baffle 170.

FIG. 2 is a top plan view of the reflector plate 128. The reflector plate 128 includes the plurality of gas passages 175, the gas inlet 180, and a plurality of lift pins holes 223. The lift pin holes 223 may allow a lift pin 122 to pass through the reflector plate 128 in order to engage the substrate 112. The lift pins 122 may receive the substrate 112 when the robot or paddle brings the substrate 112 into the RTP chamber 100, and may move the substrate 112 from a post-cooling position to a transfer position or from a transfer position to a processing position. The plurality of gas passages 275 may allow the passage of gas from the second volume $V_2$ to the first volume $V_1$ when the substrate 112 is moves from the processing position to the transfer position. Alternatively, the plurality of gas passages 175 may allow the passage of gas from the first volume $V_1$ to the second volume $V_2$ when the substrate 112 is moves from the transfer position to the processing position. The plurality of gas passages 275 may include a needle valve, a dynamic valve, a mass flow controller (MFC) valve, or any other suitable type of valve. The valves may be configured for a flow rate before installation in the gas passages, or can be varied by a controller during operation of the RTP chamber 100.

In some embodiments, the number of gas passages 175 (e.g., the gas passage density) increases as the distance from the center of the reflector plate 128 increases. The increase of gas passage density allows for additional convection of the cooling gas along the substrate 112. As the substrate 112 moves toward the reflector plate 128, the cooling gas spreads towards the edges of the reflector plate 128, convectively cooling the substrate 112. The additional gas passages 175 further from the center of the reflector plate 128 allow for the cooling gas to escape, preventing the trapping of the cooling gas between the substrate 112 and the reflector plate 128 and subsequent displacement of the substrate 112.

FIG. 3 illustrates a control schematic 300 for use within the processing chamber 100 of FIG. 1, according to embodiments of the present disclosure. A controller 320 is configured to receive data or input as sensor readings 302 from a plurality of pressure monitors 310. The controller 320 is equipped with or in communication with a system model 306 of the processing chamber 100. The system model 306 includes a pressure model. The system model 306 is a program configured to estimate the pressure within the processing chamber 100 throughout a process. The controller 320 is further configured to store readings and calculations 304.

The readings and calculations 304 include previous sensor readings 302 as well as any other sensor readings within the processing chamber 100. The readings and calculations 304 further include the stored calculated values from after the sensor readings 302 are measured by the controller 320 and run through the system model 306. Therefore, the controller 320 is configured to both retrieve stored readings and calculations 304 as well as save readings and calculations 304 for future use. Maintaining previous readings and calculations enables the controller 320 to adjust the system model 306 over time to reflect a more accurate version of the processing chamber 100.

In embodiments described herein, the controller 320 includes a programmable central processing unit (CPU) that is operated with a memory and a mass storage device, an input control unit, and a display unit (not shown). The controller 320 monitors the cooling gas and movement speed of the edge ring 114 during the shift to/from the transfer position to/from the processing position. Support circuits are coupled to the CPU for supporting the processor in a conventional manner. In some embodiments, the controller 320 includes multiple controllers 320, such that the stored readings and calculations 304 and the system model 306 are stored within a separate controller from the controller 320 which operations the processing chamber 100. In other embodiments, all of the system model 306 and the stored readings and calculations 304 are saved within the controller 320.

The controller 320 is configured to control the heating and gas flow through the processing chamber 100 by controlling aspects of the actuator and gas flow controls 308. The actuator and gas flow controls 508 include actuator 178, gas inlet 180, and the exhaust pump.

The controller 320 is configured to adjust the actuator and gas flow controls 308 based off the sensor readings 302, the system model 306, and the stored readings and calculations 304. The controller 320 includes embedded software and a compensation algorithm to calibrate pressure monitor 310 shifts to the processing chamber 100. The speed of the movement of the edge ring 114 by the actuator 178 may be increased or decreased based on the shift in pressure from the front side of the reflector plate 128 to the backside of the reflector plate 128 while shifting from the processing position to the post-cooling position and from either the transfer position or post cooling position back to the processing position. The acceleration of the actuation may be from about 5 m/s² to about 15 m/s², such as about the speed of gravity (e.g., 9.8 m/s²). The speed of the actuation may be from about 0.1 m/s to about 1 m/s, such as about 0.3 m/s. The speed of the actuation of the edge ring 114 from the processing position to the post-cooling position, and from either the transfer position or post cooling position back to the processing position controls the rate in which the gas flows into and out of the baffle 170. The controller 320 adjusts the actuator and gas flow controls 308 in order to synchronize the rate of expansion or contraction of the baffle 170 in order to accommodate the flow of gas to or from the baffle 170, respectively. The controller 320 may include a machine-learning algorithm and may use a regression or clustering technique. The algorithm is an unsupervised or a supervised algorithm.

In summary, the disclosure relates to a reflector plate assembly within a processing chamber including a reflector plate with a plurality of gas passages in communication with a baffle. As a substrate disposed within the processing chamber is moves toward the reflector plate while shifting from a processing position to a post-cooling position, a process gas cools the substrate. The plurality of gas passages and the baffle allow the process gas to pass through the reflector plate in order to prevent the substrate from being displaced on the substrate support. The speed and acceleration of the substrate toward the reflector plate are monitored by a controller to synchronize the rate of expansion or contraction of the baffle to prevent the substrate from moving on the substrate support. By preventing movement of the substrate on the substrate support, the throughput of the processed substrates is increased.

While the foregoing is directed to embodiments of the present disclosure, other and further embodiments of the disclosure may be devised without departing from the basic scope thereof, and the scope thereof is determined by the claims that follow.

What is claimed is:

1. A reflector plate assembly, comprising:
a reflector plate, the reflector plate comprising:
   a gas conduit;
   a plurality of gas passages having a first opening on a front side of the reflector plate and a second opening on a backside of the reflector plate adjacent to the gas conduit; and
   a gas inlet; and
a baffle, wherein the baffle is attached at a first end to a support base of an edge ring, and attached at a second end to the backside of the reflector plate and forming an opening in the backside of the reflector plate to the gas conduit.

2. The reflector plate assembly of claim 1, wherein the baffle has a first volume greater than or equal to a second volume, the second volume being a distance between from a lift pin to a backside of a substrate multiplied by an area of the backside of the substrate.

3. The reflector plate assembly of claim 1, wherein the plurality of gas passages comprise a valve.

4. The reflector plate assembly of claim 3, wherein the valve is a needle valve, a dynamic valve, or a mass flow controller (MFC) valve.

5. The reflector plate assembly of claim 1, wherein the baffle comprises steel or teflon.

6. The reflector plate assembly of claim 1, wherein a gas passage density increases as a distance from a center of the reflector plate increases.

7. A processing chamber, comprising:
an edge ring for supporting a substrate in the processing chamber, the edge ring comprising a support base;
a heating apparatus spaced apart from a front side of a substrate;
a reflector plate assembly spaced apart from a backside of a substrate, the reflector plate assembly comprising:
   a reflector plate, the reflector plate comprising:
      a gas conduit;
      a plurality of gas passages having a first opening on a front side of the reflector plate and a second opening on a backside of the reflector plate adjacent to the gas conduit; and
      a gas inlet; and
   a baffle, wherein the baffle is attached at a first end to a support base of an edge ring, and attached at a second end to the backside of the reflector plate and forming an opening in the backside of the reflector plate to the gas conduit.

8. The reflector plate assembly of claim 7, wherein the baffle has a first volume greater than or equal to a second volume, the second volume being a distance between from a lift pin to a backside of a substrate multiplied by an area of the backside of the substrate.

9. The reflector plate assembly of claim 7, wherein the plurality of gas passages comprise a valve.

10. The reflector plate assembly of claim 9, wherein the valve is a needle valve, a dynamic valve, or a mass flow controller (MFC) valve.

11. The reflector plate assembly of claim 7, wherein the baffle comprises steel or teflon.

12. The reflector plate assembly of claim 7, wherein a gas passage density increases as a distance from a center of the reflector plate increases.

13. A controller storing instructions that when executed by a computer processor, cause the controller to perform operations of:

actuating components of a processing chamber between a processing position, a post-cooling position, and a transfer position, the processing chamber including:

an edge ring for supporting a substrate in the processing chamber, the edge ring comprising a support base;

a heating apparatus spaced apart from a front side of a substrate;

a reflector plate assembly spaced apart from a backside of a substrate, the reflector plate assembly comprising:

a reflector plate, the reflector plate comprising:

a gas conduit;

a plurality of gas passages having a first opening on a front side of the reflector plate and a second opening on a backside of the reflector plate adjacent to the gas conduit; and a gas inlet; and a baffle, wherein the baffle is attached at a first end to a support base of an edge ring, and attached at a second end to the backside of the reflector plate and forming an opening in the backside of the reflector plate to the gas conduit;

adjusting an actuator and gas flow controls based off one or more of sensor reading, a system model, and stored readings and calculations; and synchronizing a rate of expansion or contraction of the baffle with a flow of gas to or from the baffle.

14. The controller of claim 13, wherein the baffle has a first volume greater than or equal to a second volume, the second volume being a distance between from a lift pin to a backside of a substrate multiplied by an area of the backside of the substrate.

15. The controller of claim 13, wherein the plurality of gas passages comprise a valve.

16. The controller of claim 15, wherein the valve is a needle valve, a dynamic valve, or a mass flow controller (MFC) valve.

17. The controller of claim 15, wherein the controller may adjust a flow rate of the valve.

18. The controller of claim 13, wherein the baffle comprises steel or teflon.

19. The controller of claim 13, wherein a gas passage density increases as a distance from a center of the reflector plate increases.

20. The controller of claim 13, wherein the controller may include a machine-learning algorithm.

* * * * *